United States Patent [19]
Kapoor

[11] Patent Number: 6,117,736
[45] Date of Patent: Sep. 12, 2000

[54] METHOD OF FABRICATING INSULATED-GATE FIELD-EFFECT TRANSISTORS HAVING DIFFERENT GATE CAPACITANCES

[75] Inventor: Ashok K. Kapoor, Palo Alto, Calif.

[73] Assignee: LSI Logic Corporation, Milpitas, Calif.

[21] Appl. No.: 08/791,244

[22] Filed: Jan. 30, 1997

[51] Int. Cl.[7] .............................................. H01L 21/8234
[52] U.S. Cl. ...................... 438/275; 438/279; 438/287; 438/981
[58] Field of Search ..................................... 438/275, 276, 438/277, 278, 279, 287, 290, 591, 981; 148/DIG. 163

[56] References Cited

U.S. PATENT DOCUMENTS

| | | | |
|---|---|---|---|
| 3,837,071 | 9/1974 | Romen | 438/275 |
| 3,886,003 | 5/1975 | Takagi et al. | 438/275 |
| 4,003,071 | 1/1977 | Takagi | 438/275 |
| 4,918,026 | 4/1990 | Kosiak et al. | 438/207 |
| 5,057,449 | 10/1991 | Lowrey et al. | 438/275 |
| 5,480,828 | 1/1996 | Hsu et al. | 148/DIG. 116 |
| 5,576,226 | 11/1996 | Hwang | 438/275 |

*Primary Examiner*—Michael Trinh

[57] ABSTRACT

A static random-access memory integrated circuit formed on a single substrate includes a storage IGFET formed on the substrate and having a first area and a first capacitance. A gating FET formed on the substrate has an area substantially equal to the first area with a capacitance substantially less than the first capacitance. In one aspect, the storage FET has a substantially thicker gate oxide than the gating FET. In another aspect, the gate oxide of one of the FETs is formed from a different material than that of the other FET. A method for fabricating such IGFETs on a single substrate is also provided in which source and drain regions are formed adjacent the surface of the substrate. A first layer of gate oxide is formed on the surface of the substrate over the channels of the first and the second FETs. The first layer of gate oxide is then covered by a nitride layer which is thereafter etched away over the channel of one of the FETs. A second layer of gate oxide is deposited on the first layer of gate oxide exposed as a result of the etching. Thereafter, the nitride layer and that portion of the first layer of gate oxide not over the channel of either FET are both removed.

9 Claims, 2 Drawing Sheets

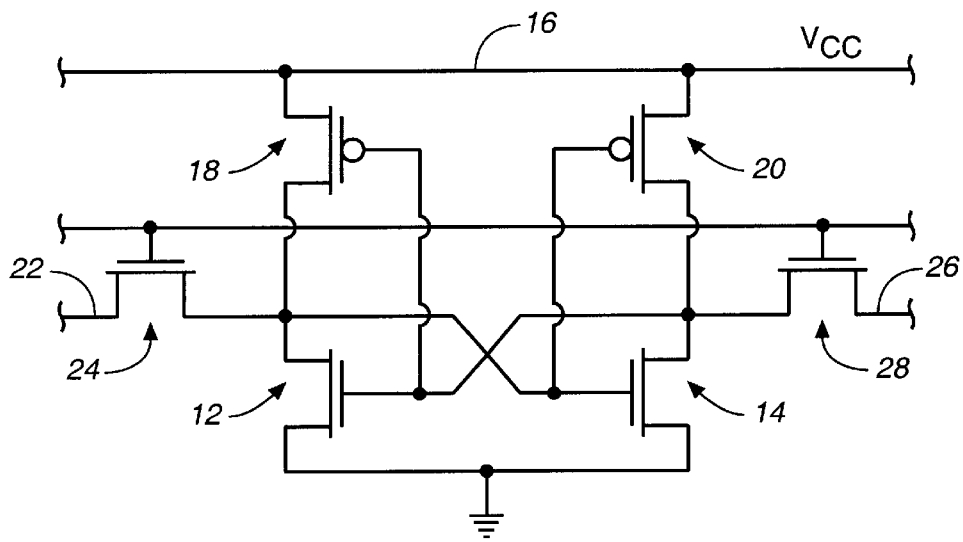
FIG._1
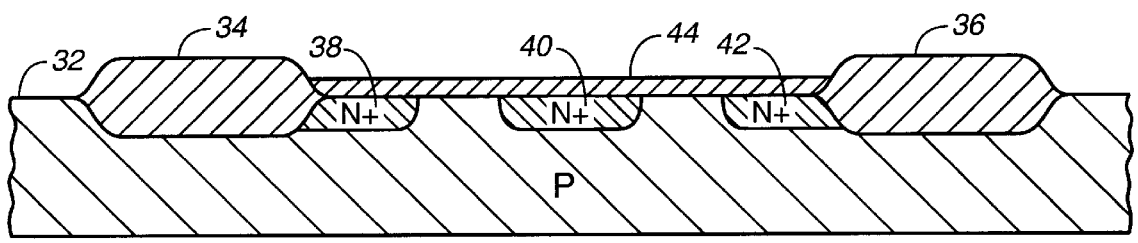
FIG._2
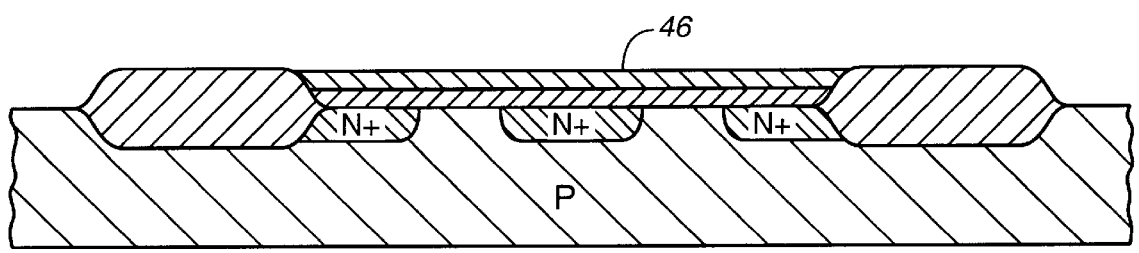
FIG._3

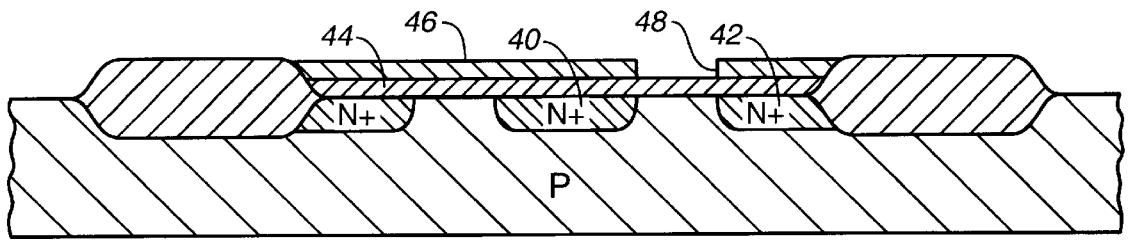
FIG._4
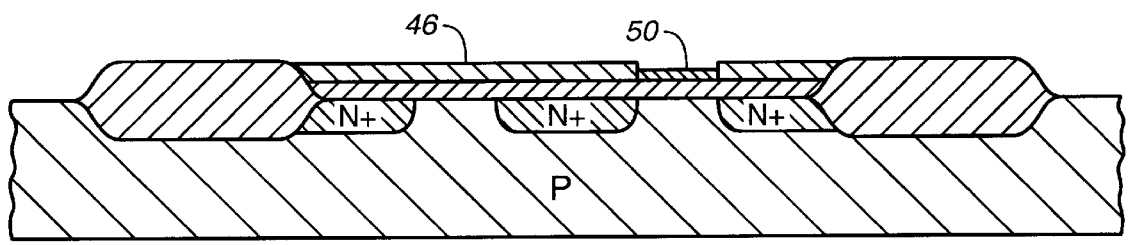
FIG._5
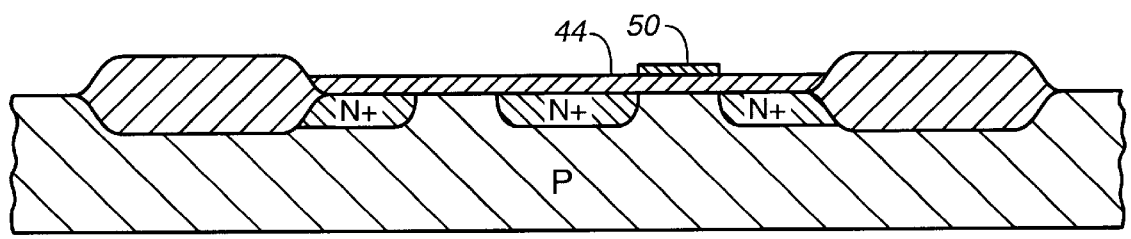
FIG._6
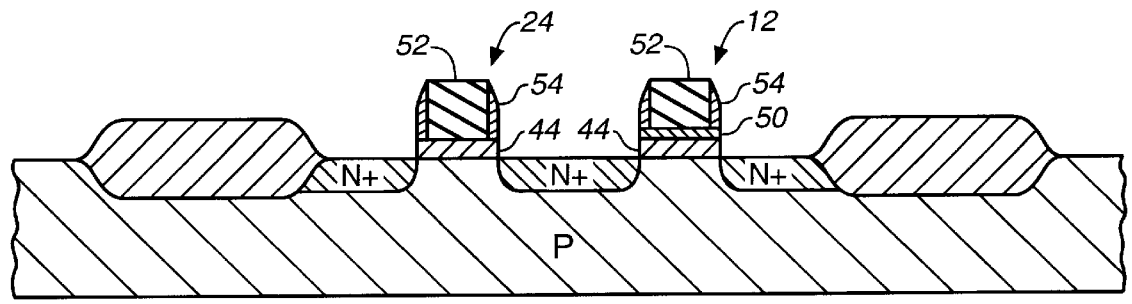
FIG._7

METHOD OF FABRICATING INSULATED-GATE FIELD-EFFECT TRANSISTORS HAVING DIFFERENT GATE CAPACITANCES

BACKGROUND OF THE INVENTION

1. Field of the Invention

The present invention relates generally to insulated-gate field-effect transistors and more particularly to such transistors formed on a single substrate and having different gate capacitances.

2. Description of the Related Art

In some circumstances, for example, static random access memory (SRAM) implemented with insulated-gate field-effect transistors (IGFETs), it is desirable to form IGFETs on a single semiconductor substrate with some having substantially larger gate capacitances than others. An SRAM cell implemented with IGFETs typically includes a bistable circuit in the form of a cross-coupled flip-flop. A pair of gating transistors couple storage transistors in the cell to different bit lines. The gating transistors are turned on and off to read the state of the cell, i.e., to apply a high or low voltage to the associated bit line. When one of the gating transistors is turned on, charge flows from the storage transistor and, if sufficient flow occurs, thereby change the state of the cell. It is obviously undesirable for the cell state to change when the state is read. To prevent such unintended state changes, the storage FET in the cell is typically made 4–5 times larger than that of the gating FET. A storage transistor having a substantially larger area, and therefore a substantially larger capacitance, prevents substantial charge flow during a read operation thereby preventing an unintended state change in the cell responsive to the read operation.

Utilizing transistors which are 4–5 times larger than other transistors on the substrate is disadvantageous, however, because it takes up area on the semiconductor substrate and thereby limits the number of devices which can be formed on the substrate.

It would be desirable to provide IGFETs formed on a single substrate and having different gate capacitances which utilize less area than such prior art IGFETs.

SUMMARY OF THE INVENTION

An integrated circuit formed on a single substrate comprises a first FET formed on the substrate and having a first area and a first capacitance. A second FET formed on the substrate has an area substantially equal to the first area with a capacitance substantially less than the first capacitance. In one aspect, one of the FETs has a substantially thicker gate oxide than the other FET. In another aspect, the gate oxide of one of the FETs is formed from a different material than that of the other FET.

A method for fabricating such IGFETs on a single substrate is also provided in which source and drain regions are formed adjacent the surface of the substrate. A first layer of gate oxide is formed on the surface of the substrate over the channels of the first and the second FETs. The first layer of gate oxide is then covered by a nitride layer which is thereafter etched away over the channel of one of the FETs. A second layer of gate oxide is deposited on the first layer of gate oxide exposed as a result of the etching. Thereafter, the nitride layer and that portion of the first layer of gate oxide not over the channel of either FET are both removed.

The foregoing and other objects, features and advantages of the invention will become more readily apparent from the following detailed description of a preferred embodiment which proceeds with reference to the drawings.

BRIEF DESCRIPTION OF THE DRAWINGS

FIG. 1 is a schematic diagram of an SRAM cell implemented with IGFETs.

FIGS. 1–7 are schematic sectional views of process steps depicting the formation of two of the IGFETs in the circuit of FIG. 1.

DETAILED DESCRIPTION OF THE PREFERRED EMBODIMENT

FIG. 1 depicts an SRAM memory cell in which the present embodiment of the invention is incorporated. The cell includes NMOS memory transistors 12, 14. Memory transistor 12 is coupled to a $V_{CC}$ line 16 through PMOS transistor 18 and memory transistor 14 is coupled to $V_{CC}$ line 16 through a PMOS transistor 20. Transistor 12 is coupled to a first bit line 22 via NMOS gating transistor 24. In a similar fashion, memory transistor 14 is coupled to a second bit line 26 via an NMOS gating transistor 28.

The schematic diagram for the SRAM cell depicted in FIG. 1 is known in the art; however, the manner in which the SRAM cell is fabricated, and the resulting integrated circuit, are the subject of the present invention as illustrated in the preferred embodiment described with reference to FIGS. 2–7.

Referring to FIGS. 2–7, the construction of a pair of IGFETs in accordance with the invention is sequentially illustrated by construction of a pair of N channel transistors in an opening in an insulation layer. In FIG. 2, a P-type semiconductor substrate 32, such as a P doped silicon wafer, has field oxide portions 34, 36 grown therein with N+ doped regions 38, 40, 42 being formed adjacent to surface of substrate 32 in a known manner. As will later become more fully apparent, regions 38, 40 comprise source and drain regions for FET 24, which is referred to herein as a second FET, and regions 40, 42 comprise source and drain regions for FET 12, which is referred to herein as a first FET. The area between regions 38, 40 comprises the channel of FET 24 and the area between regions 40, 42 comprises the channel of FET 12. After field oxides 34, 36 and N+ doped regions 38, 40, 42 are formed on substrate 32 as shown, a first layer of gate oxide 44 is deposited on the surface of the substrate between field oxide regions 34, 36, as shown in FIG. 2.

Thereafter, a nitride layer 46 is deposited on gate oxide 44, as shown in FIG. 3.

With reference to FIG. 4, the area above the channel defined between N+ doped regions 40, 42 is masked thereby creating an opening 48 in nitride layer 46 which exposes that portion of gate oxide layer 44 above the channel defined between regions 40, 42.

Next, with reference to FIG. 5, a second layer of gate oxide 50 is deposited, such being deposited only on that portion of gate oxide layer 44 exposed by opening 48 in nitride 46.

Thereafter, the remainder of nitride layer 46 is etched away thus exposing oxide layer 44, except for that portion covered by oxide layer 50, as depicted in FIG. 6.

Thereafter, polysilicon gate material 52 is formed on the upwardly directed exposed surface of gate oxide layer 44 in transistor 24 and on the exposed surface of gate oxide layer 50 in transistor 12. Similarly, oxide shoulders 54 are formed about the circumference of gate material 52 in each of transistors 24, 12. Gate material 52 and oxide shoulders 54 are deposited and formed in a known manner.

Alternately, different gate materials can be deposited in substantially the same thickness for each transistor but using different materials which produce different gate capacitances, e.g., silicon dioxide and silicon nitride. In still another embodiment, layer 44 can be one type of gate oxide material with layer 46 being another type of material, e.g., silicon dioxide and silicon nitride.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

What is claimed is:

1. A method for fabricating insulated-gate field-effect transistors on a single substrate comprising:

forming source and drain regions adjacent the surface of the substrate for a first FET and a second FET;

forming a first layer of gate oxide on the surface of the substrate;

forming a nitride layer over the first layer of gate oxide;

etching away the nitride layer to form a gate opening for the first FET;

depositing a second layer of gate oxide on the first layer of gate oxide exposed as a result of the etching; and removing the nitride layer.

2. The method of claim 1 wherein a channel is defined in said substrate between the source and drain region of each FET and wherein each channel includes substantially the same area.

3. The method of claim 2 wherein said method further includes the step of removing that portion of the first layer of gate oxide not over the channel of either FET.

4. The method of claim 1 wherein said method further comprises the step of making each FET substantially the same size.

5. The method of claim 1 wherein said method further includes:

forming a gate terminal on the second layer of gate oxide for said first FET; and forming a gate terminal on the first layer of gate oxide for the second FET.

6. A method for fabricating insulated-gate field-effect transistors on a single substrate comprising:

forming source and drain regions adjacent the surface of the substrate for a first FET and a second FET;

forming a first layer of gate oxide on the surface of the substrate;

forming a nitride layer over the layer of gate oxide;

etching away the nitride layer to form a gate opening for the second FET;

etching away a portion of the layer of gate oxide exposed as a result of the nitride etching; and removing the nitride layer.

7. The method of claim 6 wherein a channel is defined in said substrate between the source and drain region of each FET and wherein each channel includes substantially the same area.

8. The method of claim 7 wherein said method further includes the step of removing that portion of the first layer of gate oxide not over the channel of either FET.

9. The method of claim 6 wherein said method further comprises the step of making each FET substantially the same size.

* * * * *